United States Patent [19]

Gregory, Jr. et al.

[11] Patent Number: 5,262,716
[45] Date of Patent: Nov. 16, 1993

[54] TESTER CALIBRATION PROCEDURE WHICH INCLUDES FIXTURING

[75] Inventors: Walter L. Gregory, Jr., Loveland; Jay M. Stepleton, Boulder; Davis M. Glasgow, Loveland; Kay C. Lannen, Fort Collins, all of Colo.

[73] Assignee: Hewlett-Packard Company, Palo Alto, Calif.

[21] Appl. No.: 871,430

[22] Filed: Apr. 21, 1992

[51] Int. Cl.$^5$ .......................................... G01R 31/02
[52] U.S. Cl. ............................. 324/158 F; 324/73.1; 324/158 P
[58] Field of Search ............... 324/158 R, 73.1, 158 F, 324/158 P

[56] References Cited

U.S. PATENT DOCUMENTS 4,504,783  3/1985  Zasio et al. ...................... 324/158 R
5,099,196  3/1992  Longwell et al. .................. 324/73.1

OTHER PUBLICATIONS

Jay M. Stapleton; A New System Architecture for a Combined In-Circuit/Functional Tester; 1989; pp. 763-772.
Barry A. Alcorn; Writing Correct & Usable Specifications for Board Test: A Case Study; 1989; pp. 773-786.
Philip N. King; Flexible, High-Performance Pin Electronics Implementation; 1989; pp. 787-794.
Maintaining the HP 82000, HP82000 Models D200/D50, Revision 2, Dec. 1989, pp. 5-1 to 5-37.

Primary Examiner—Ernest F. Karlsen

[57] ABSTRACT

A system and method for calibrating testers. A reference timing signal and an internal timing signal used in tester calibration are generated within a tester. A first calibration is performed wherein test module channel characteristics are measured and recorded, and an adjustment value is determined to correct the time placement of the internal timing signal. Driver and receiver delays are adjusted based on the characteristics measured in this first calibration, and the internal timing signal is adjusted as well. A second calibration is performed wherein temporal relationships between the adjusted internal timing signal and signals at the test module channel mint pins are determined. Driver and receiver delays are adjusted based on the results of this calibration. An optional calibration is performed wherein temporal relationship between the adjusted internal timing signal and signals at the board-interface end of a test fixture are measured. Using these measurements and the measurements obtained in the second calibration, a test fixture characterization is performed and recorded. Delays of the drivers and receivers are again adjusted to account for the fixture characteristics. Additional calibration methods provided by the present invention include a manual multi-module calibration to keep test module channels aligned when a new module is designated as the master module, and a manual synchronization clock calibration to deskew drivers and receivers relative to an external clock supplied by the device under test.

17 Claims, 12 Drawing Sheets

PIN CARD CALIBRATION 406

TESTER CALIBRATION PROCEDURE WHICH INCLUDES FIXTURING

BACKGROUND OF THE INVENTION

1. Field of the Invention

The present invention relates generally to board testers, and more specifically to an improved tester calibration technique.

2. Related Art

Board testers are widely used in the electronics industry as a tool for board troubleshooting and performance evaluation. These testers are used to perform functions such as integrated manufacturing testing, board diagnostics and troubleshooting, and performance verification.

A goal of tester calibration is making all the resources used for board testing look the same to the tester and to the circuit board under test. More specifically, a goal of tester calibration is to synchronize all signals at the board-to-tester interface with themselves, and optionally, with a reference signal from the device under test.

A specific example is synchronizing test-module-channel timing. Here the goal is adjusting the timing of drivers and receivers of test modules so that signals from all drivers are closely synchronized to one another when they reach the device under test. In other words, a signal generated in the tester should be sent from all drivers at the same time and further, should pass through a test fixture to arrive at the proper pins on the circuit board under test at the same time.

A conventional approach toward synchronizing driver timing used in the industry is to use very high speed reference signals. This approach reduces the skew time between signals but is very costly to implement and the high-speed circuitry (typically ECL) consumes a lot of power.

An additional approach that is commonly used in the IC test industry, but only recently in the board test industry, is a distributed approach. The distributed approach puts an adjustment on each driver itself, thereby allowing each driver to be adjusted individually. Conventional implementation of this approach to date is referred to in the industry as "autocal." Autocal measures each of the digital channels individually via a calibration path within the tester and allows all drivers to be aligned in time with one another.

However, autocal itself is limited. First, each channel is measured via a different path, and as a result, channel-to-channel synchronization accuracy suffers. Second, the channels are only synchronized with one another and cannot be synchronized with a central timing reference of the tester. This leads to a systematic offset with the timing reference and additional systematic errors when multiple timing reference sources are used within the tester. Autocal, therefore, provides a decent initial calibration of the tester but is far from ideal.

Another disadvantage of conventional calibration techniques is that they do not allow calibration of a test fixture. The test fixture is the interface between the tester and the device under test. The test fixture is essentially an adapter, wired to send signals from certain channels of the tester to certain pins of the device under test. Since there are various signal paths within a text fixture, the different propagation delays can cause signals to be skewed at the board interface. For example, multiple bits of an address may arrive at their board destinations at different times due to different path lengths within the fixture.

One conventional approach to minimizing the effects of fixtures on signal synchronization is to design and manufacture the fixtures in such a way that the various signal paths within a fixture are all of the same length. This process is both tedious and costly.

SUMMARY OF THE INVENTION

A system and method for calibrating testers to improve the time accuracy of placement of signal edges at the device under test, and to improve the time accuracy of sampling input digital signals is provided by the present invention.

A test system is provided which comprises a plurality of test modules. The test modules each comprise: a signal generator for generating an internal timing signal; a signal generator for generating a reference timing signal; a plurality of test interface channels for interfacing to a device under test; a time measurement device for measuring the time difference between edges of the internal timing signal and edges of a test signal received by a test probe; a probe interface channel for receiving test signals from the test probe; and a test probe for receiving test signals at various locations.

A coarse calibration method is provided whereby driver and receiver characteristics are measured and recorded, an internal timing signal adjustment value is determined and the signal adjusted accordingly. In this first calibration, driver and receiver delays are adjusted based on the characteristics measured. This first method is the autocal procedure.

A second, more accurate, calibration method is provided whereby test-module channels of the tester are calibrated based on signal timing measurements taken between a reference signal and a test signal sampled by the test probe.

The results of the second calibration can be combined with the results of the autocal coarse calibration to more closely align the test module channels with each other and with a reference signal.

A third calibration method is provided whereby measurements are taken at the board-interface end of the test fixture. Using these measurements, a characterization through the test fixture is performed and recorded.

Combining the results of the second calibration with this third fixture calibration, provides a characterization for the fixture alone. This fixture characterization allows errors induced by fixture dissimilarities (e.g. varying wire lengths) to be modeled out of the tester. Recording the fixture characterization and transporting it among testers with the fixture allows fixture errors to compensated for independently of the tester. Also saving fixture characterizations independently allows one fixtures to be used with multiple testers.

Additional calibration techniques are also offered to enhance tester performance. These techniques include a manual multi-module calibration and a manual synchronization to clock calibration. The manual multi-module calibration is provided as a part of the present invention to keep drivers and receivers of all test modules aligned despite the fact that any of the modules in the test system may be configured as the master module, even if that module was not the master module during a previous manual receiver and driver timing calibration.

The manual synchronization to clock calibration is provided to deskew drivers and receivers relative to an external clock supplied by the device under test.

FEATURES AND ADVANTAGES OF THE PRESENT INVENTION

One key advantage of the improved calibration method of the present invention is that a set of calibration measurements can be made at the "end" of the fixture (at the device under test) as opposed to inside the tester as done by conventional calibration techniques. Not only does this give a better calibration of the basic tester, but it provides characterization of the fixture as well. Because the wire lengths vary among test fixtures, error is typically introduced by adding a fixture to a calibrated tester. The calibration technique of the present invention allows characterization of test fixtures, and removal of fixture-induced errors.

A related advantage of the present invention is that the characterized fixture is transportable between testers without having to repeat the fixture calibration process. This is feasible because in the technique of the present invention, the tester is fully calibrated without a fixture in place, then, the fixture is added and a calibration is completed at the end of the fixture. Using the results of the tester calibration with and without the fixture, information is learned about the characteristics of the fixture. A fixture characterization record is made and kept separate from the tester calibration files. Thus, when a fixture is moved to a different tester, the fixture-only calibration information can follow the fixture to the new tester and can be incorporated into the overall calibration there without the need to repeat the calibration procedure.

Another advantage of the present invention is that all digital channels are calibrated with respect to a measurable "point" as opposed to an assumed or theoretical reference. This reference "point" is an interface pin where an external clock signal can be applied to the tester. Thus the internal signal path through the tester and the fixture is measured, not assumed, yielding a more accurate calibration.

In addition, according to the present invention, all tester channels are aligned with an actual edge of a clock signal supplied by the device under test. Therefore, the tester signals can be synchronized not only with themselves, but also with the device under test.

Delays for digital channels in a tester can be characterized as "fixed" or "variable." A "fixed" delay is not very sensitive to environmental changes, such as a length of wire or a printed circuit board trace. The delay of such an element would change very little with a change in ambient temperature, for example.

A variable delay, on the other hand, is affected by changes in the environment. An example of a "variable" delay element is a formatter integrated circuit or an output driver circuit. The propagation delay times of these elements can change noticeably with a significant change in temperature.

The calibration procedure of the present invention effectively separates the "variable" and "fixed" delays. The calibration procedure is divided into two major phases: an automatic portion and a manual portion. The automatic portion ("autocal") is quite useful at detecting changes in delay in "variable" path elements and recharacterizing the system. The automatic portion, which establishes a base measurement of the path elements at a given temperature, is completed before the manual portion ("accuadjust") is begun. The manual calibration, which corrects for fixed delays, has the effect of "fine tuning" the initial calibration of the digital channels done by the automatic portion.

Thus, when the temperature changes, the automatic portion can be re-executed to recalibrates for delay changes in the "variable" elements. The separately learned manual portion corrections can then be applied to this latest automatic calibration to provide a very accurate calibration without the need to repeat the manual portion of the calibration.

As a result, the manual calibration must be performed very infrequently. A manual calibration will typically be done about once every six months, when a part of the tester is replaced for repair, or to calibrate a newly built fixture.

Another key advantage to the technique of the present invention is the accuracy that can be achieved by using the same physical path to measure, and thus calibrate, each digital channel. This makes it possible to get a very uniform and accurate calibration even in a modular tester which would normally have distributions that were "clustered" about each individual module.

A special tester resource, "the probe", is also included in the improved digital calibration procedure. Because the probe is used as the sole measurement path with which to perform the manual calibration, it, by default, becomes the "best" calibrated channel in the system. In other words, the probe will be in the center of the distribution because it was used as the "reference" to which all other channels were calibrated.

Another advantage of the present invention is that calibration results are automatically "folded into" the users' test. The calibration procedure characterizes the system over all possible configurations. When the user selects a specific configuration for use in the test, the tester software will automatically apply the calibration information needed for that specific configuration. The underlying architecture allows each digital channel to be configured, and thus calibrated, independently. Hence, each channel can be independently adjusted to get a very precise calibration.

Figure 1:
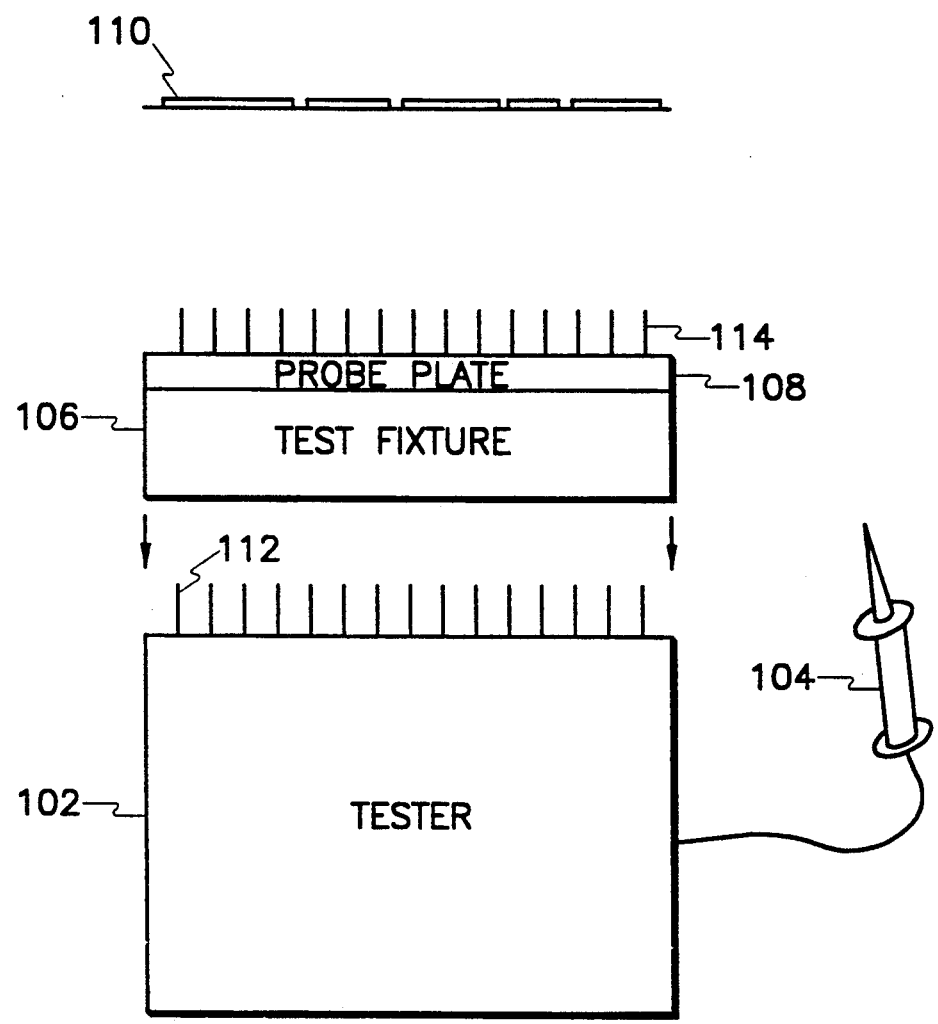
FIG. 1 is a high-level block diagram of a tester.

Further features and advantages of the present invention, as well as the structure and operation of various embodiments of the present invention, are described in detail below with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE INVENTION

1. Overview and Environment of the Present Invention

The present invention is a system and method for improved calibration of testers. According to the system and method of the present invention, tester calibration can be performed to an accuracy greater than that achieved by conventional techniques alone. The present invention provides calibration methods to be used by themselves or in combination with the conventional autocal technique found in present systems.

FIG. 1 illustrates a high-level block diagram of a board of a tester configuration. The test configuration consists of a tester 102, a hand-held test probe 104, and a test fixture 106. Test fixture 106 includes a probe plate 108 which includes fixture nails 114 for interfacing a circuit board 110 to fixture 106.

Tester 102 includes a controller card (not shown) which generates reference timing signals and contains a time interval counter. Tester 102 also includes at least one PIN card (not shown) for sending and receiving signals to and from the board to be tested. The PIN card includes format chips for adjusting the delay of the signals sent and received, and driver and receiver pairs for sending and receiving the signals. The signals are sent and received via pins called "mint pins" 112. Pin cards typically have eight test-module channels each comprising a format chip and a driver and receiver pair. A 9:1 multiplexer is included to allow the eight channels of driver/receiver pairs to interface to 72 mint pins 112.

Tester 102 also contains an Analog In-Circuit Measurement AIM card (not shown) which includes probe circuitry. The probe circuitry contains a probe receiver for receiving the signal picked up by test probe 104 and a format chip for adjusting the sampling of the received signal.

Fixture 106 is essentially an adapter for interfacing the circuit board 110 to be tested to tester 102. Fixtures 106 are wired to provide the appropriate interface between circuit board 110 and tester 102.

The environment of the present invention is a tester as described above with reference to FIG. 1. More specifically, the techniques of the present invention were developed for implementation in the Hewlett Packard 3070 family of test systems, available from the Hewlett-Packard Company. These are modular test systems capable of supporting up to four test modules.

2. Preferred Hardware Embodiment of the Present Invention

Figure 2A:
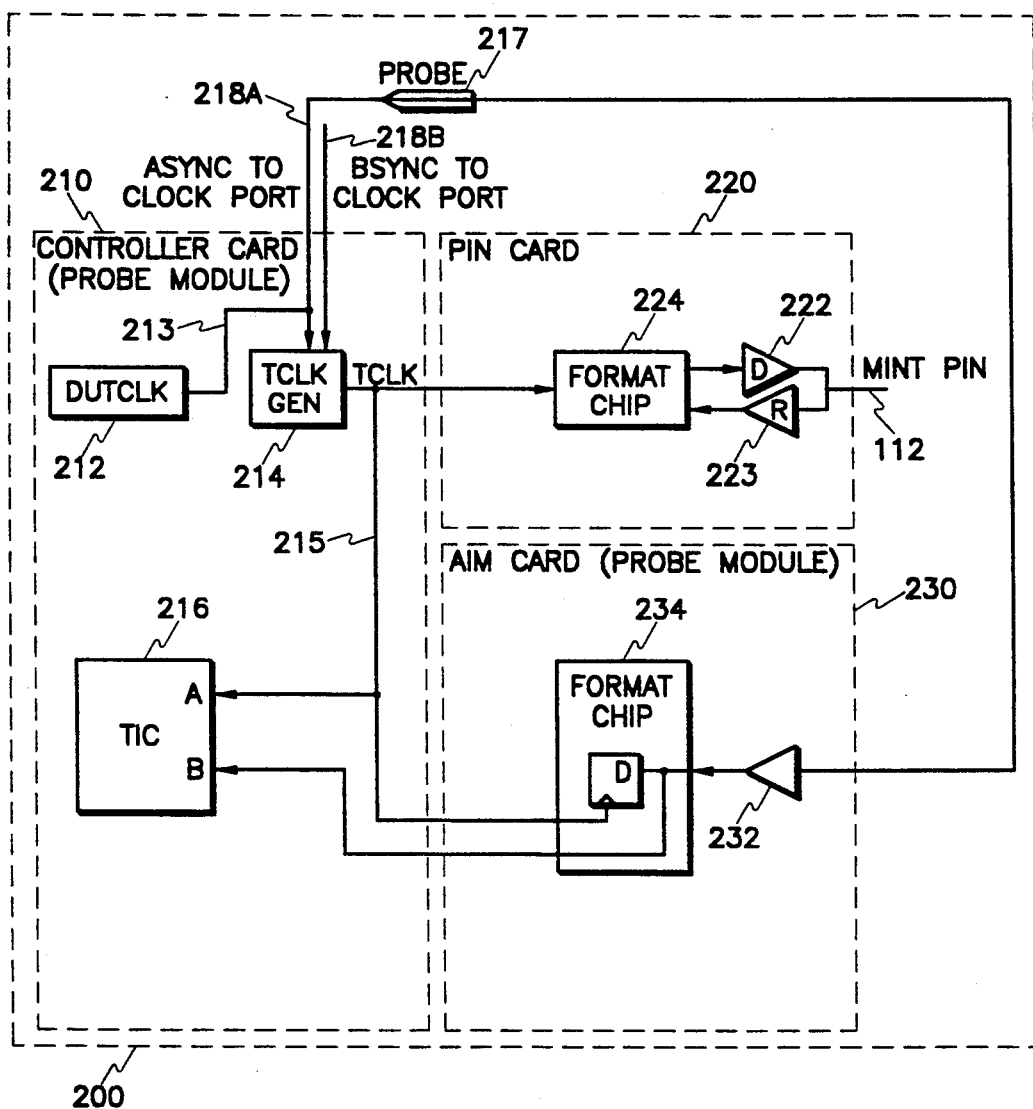
FIG. 2A is a block diagram illustrating an internal configuration of a module of a tester.

FIG. 2A is a block diagram illustrating an internal configuration of a module of a tester 200 as configured in a preferred embodiment of the present invention. Tester 200 can include up to four modules. Each module includes a controller card 210. Controller cards 210 include a signal generator 212 for generating a reference timing signal 213 (DUTCLK signal 213), a clock generator 214 for generating an internal timing signal 215 (TCLK signal 215), from a reference signal, and a time interval counter 216. Also included on the controller card 210 are sync-to-clock ports 218A and 218B for receiving an external reference signal from the device-under-test.

Circuitry is provided on controller card 210 that feeds DUTCLK signal 213 to an A Sync-to-clock ports 218A and a B Sync-to-clock port 218B and to clock generator 214. Thus, sync-to-clock-ports 218A and 218B are also pins on which DUTCLK signal 213 may be sampled by a probe 217. As will be described below, the ability to measure this DUTCLK signal 213 with probe 217 is critical to performing cal-to-the-mint-pin and cal-to-the-fixture calibrations. This feature allows the internal DUTCLK signal 213 to emulate an "external" clock source.

PIN card 220 includes drivers 222, receivers 223, and format chips 224. Format chips 224 are used for individually adjusting the delay of the drivers 222 and receivers 223. Format chips 224 are used in the tester industry to adjust the delay of drivers 222 and receivers 223. In the preferred embodiment, individual format chips 224 are provided for each test-module channel to provide an independent delay means for adjusting the delay of each channel independently.

Format chips 224 are further discussed in two papers: "A New System Architecture for a Combined In-Circuit/Functional Tester," pp. 763 to 772 written by Jay M. Stepleton for the 1989 International Test Conference; and "Flexible, High-Performance Pin Electronics Implementation," pp. 787 to 794 written by Philip N. King for the 1989 International Test Conference. The contents of these two papers are incorporated herein as a reference.

An AIM card 230 is included for interfacing probe 217 to tester 200. AIM card 230 has a probe interface channel comprising a receiver 232 for receiving signals from probe 217 and a format chip 234. Format chip 234 allows probe 217 to function as a normal receiver.

Throughout this document, language pertaining to adjusting the delay of receivers 223 and 232 actually refers to adjusting the sampling of the receivers 223 and 232.

Figure 2B:
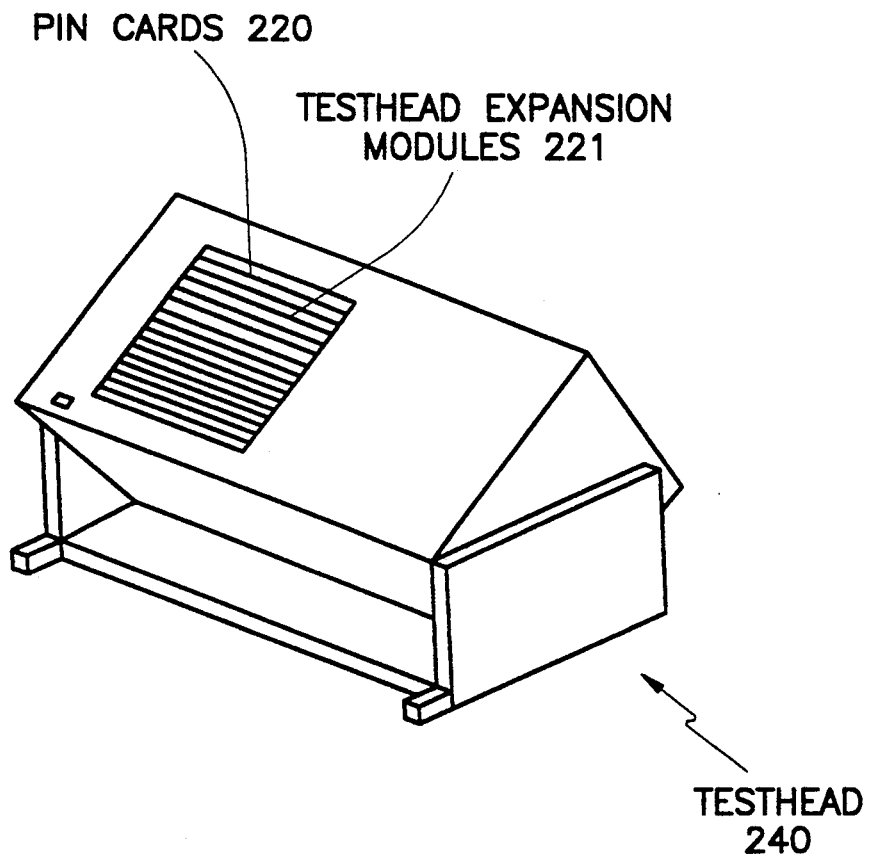
FIG. 2B is a diagram of a testhead.

FIG. 2B is an illustration of a testhead 240 which houses tester 200. Pin cards 220, AIM cards 230 and Controller cards 210 are mounted in testhead expansion modules 221 such that fixtures can be attached. Up to four testhead expansion modules 221 can be mounted in a single testhead 240.

Figure 3:
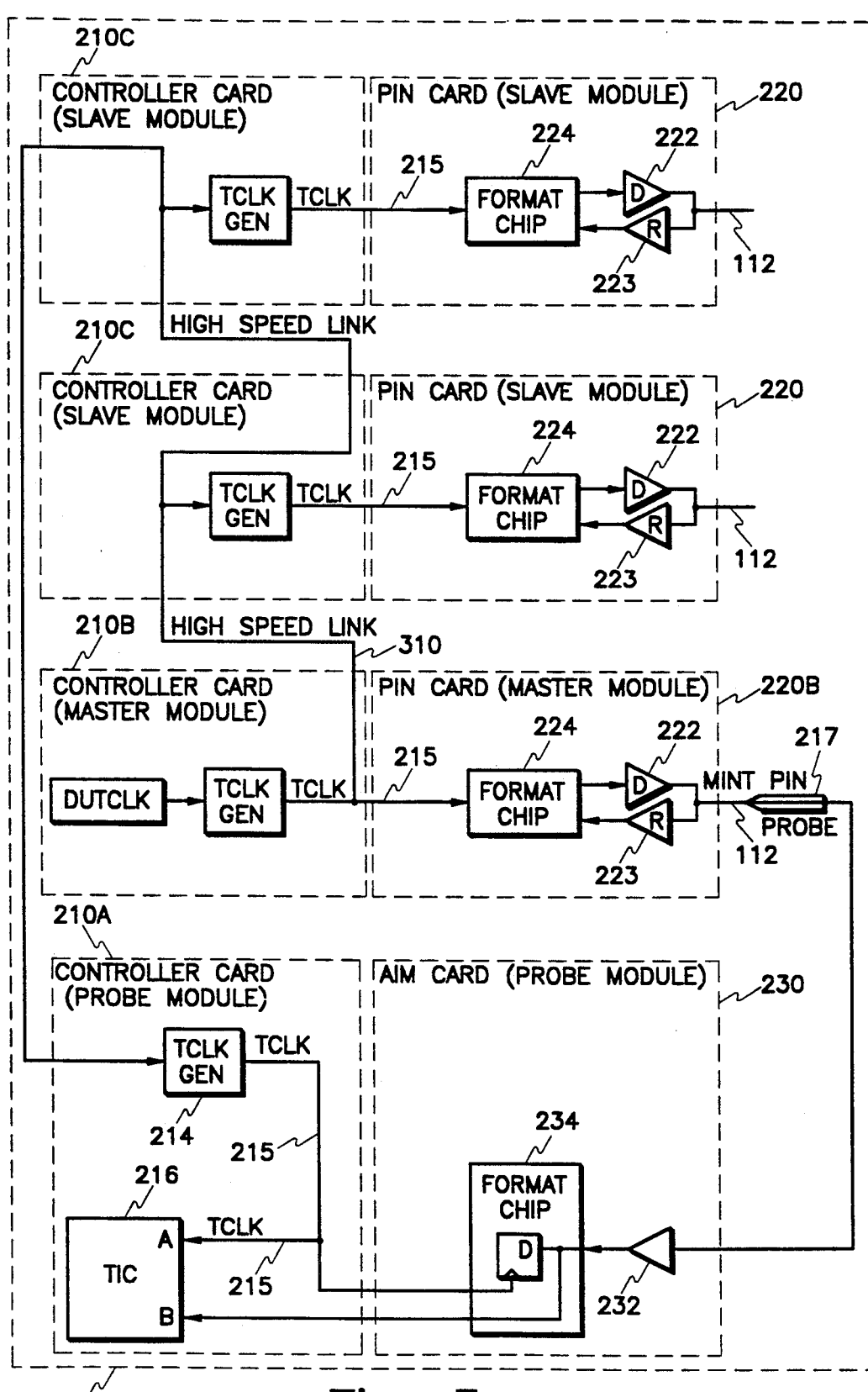
FIG. 3 is a block diagram illustrating a tester configured with multiple modules.

FIG. 3 illustrates the configuration of another embodiment of the present invention within tester 200. This embodiment allows calibration of a tester 200 configured with multiple test modules. In this embodiment, tester 200 is configured with four test modules. All of the modules consist of a controller card 210, a plurality of PIN cards (1–9) 220, and an AIM card 230. With multiple modules, not all of the cards, or circuits of cards, are "active" in each module. Only shown in FIG. 3 are the active portions of each module.

Probe 217 is attached to one of the modules in tester 200. In this module, time interval counter 216 of a controller card 210A is active and an AIM card 230 with probe circuitry is also active. This module is designated the probe module.

The other three modules are configured with an active controller card 210 and PIN cards 220. In these "non-probe" modules, the probe circuitry of controller card 210 and AIM card 230 are not active. Of these three modules, one module is configured as a master module. The master module has an active reference clock generator in its controller card 210B. The other two modules are configured as slave modules (with controller cards 210C).

3. Preferred Calibration Methods of the Present Invention

An overview of the preferred method of the present invention will now be described. According to a preferred embodiment of the present invention an autocal calibration is performed providing coarse adjustment of the driver and receiver pairs of a tester and providing a time measurement value for adjusting the internal timing signal 215. To fine tune the calibration, a "cal-to-the-mint-pin" calibration is performed in which the drivers and receivers are calibrated at the mint pins 112 with respect to a timing reference. Finally, fixture timing delays can be measured and integrated into the overall timing adjustments. This final process is referred to as "cal-through-the-fixture."

Figure 4:
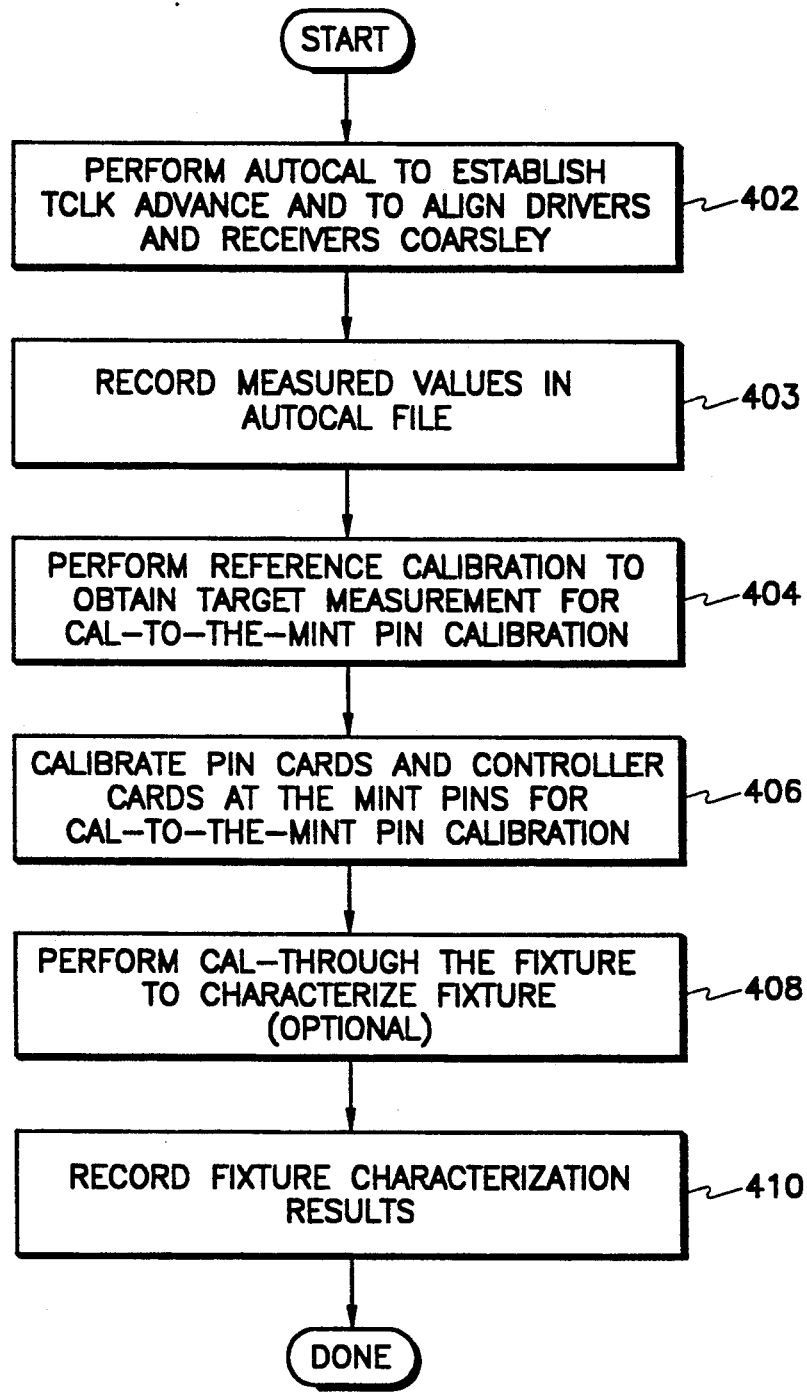
FIG. 4 is a flowchart illustrating the basic steps of tester calibration according to the present invention.

FIG. 4 illustrates a high level flowchart of a preferred tester calibration method according to the present invention. Referring to FIG. 2A, 3, and 4, a preferred calibration method of the present invention will be described. In a step 402, an automatic, coarse calibration procedure, called autocal, is performed. In performing the autocal procedure, numerous parameters of all drivers 222 and receivers 223 are characterized and adjusted. The autocal procedure also establishes a time measurement value for adjusting TCLK signal 215 called TCLK advance. TCLK advance advances TCLK signal 215 so that it occurs earlier than a reference signal at the board under test. This is done so that by the time a signal derived from TCLK signal 215 reaches the mint pins, this derived signal is aligned with the reference signal at the board under test. As a result of step 402, test-module channels and the internal timing signal 215 are characterized and adjusted.

In a step 403, the values determined in step 402 are recorded in an autocal file for use in subsequent operations. The autocal file is saved in a storage device such as disk drive or system memory.

The autocal procedures of steps 402 and 403 are commonly known in the art and are further discussed in the paper: "Writing Correct and Usable Specifications For Board Test: A Case Study," pp. 773 to 786 written by Barry A. Alcorn for the 1989 International Test Conference. The contents of this paper are incorporated herein as a reference.

In a step 404 and a step 406, a "cal-to-the-mint-pin" calibration is performed wherein at least one of the test-module channels is characterized and adjusted based on the characterization. In step 404, a reference calibration is performed whereby a time-target signal is measured with probe 217 to obtain a target time value measurement. This target time value measurement is the temporal difference between TCLK signal 215 and the time-target signal.

The time-target signal used can be either DUTCLK signal 213 or an actual external clock signal provided by the Board Under Test or an assumed reference. In the preferred embodiment, the target time signal is DUTCLK signal 213.

This target time value measurement is the measurement to which all drivers (and receivers) will be matched in subsequent steps.

In a step 406, mint pins 112 are probed by probe 217 to measure the time difference between TCLK signal 215 at clock generator 214 and a signal derived from TCLK signal 215 at the output of driver 222. Using this measurement and the measurement performed in step 404, the drivers can all be synchronized to the reference signal. Synchronization of drivers is accomplished by adjusting the amount of delay introduced in format chips 224.

Synchronization of receivers is accomplished by the tester by aligning the receivers based on the driver calibrations. In this case, drivers are considered as primary. In another embodiment, the receivers could be synchronized first in step 406 and the drivers aligned based on the results of the receiver calibration.

The autocal table is updated to reflect the refined driver 222 and receiver 223 characterizations obtained in step 404 and 406.

A cal-through-the-fixture calibration is performed at steps 408 and 410. In step 408, fixture nails 114 at the board-interface end of the test fixture 106 are probed to determine the time delay between TCLK signal 215 at clock generator 214 and the clock signal derived from TCLK signal 215 at the end of the fixture. Using this measurement and the measurements performed in steps 404, 406 and 408, the delay times through the various fixture paths can be characterized. The channels are then adjusted based on this characterization.

In step 410, the autocal table generated in the autocal procedure step 403 and updated by the cal-to-the-mint-pin calibration, is amended to include the results of the cal-through-the-fixture calibration. These fixture results are kept separate from the autocal results. As a result, the fixture calibrated is now characterized, and can be transported from tester to tester along with its characterization.

In other embodiments, not all of the steps described above need to be performed. For example, a cal-to-the-mint-pin calibration can be performed without performing the autocal procedure and the cal-through-the-fixture procedure. Alternatively, a cal-through-the-fixture calibration can be performed without first performing a cal-to-the-mint-pin calibration. In this alternative embodiment, the fixture won't be independently characterized, but the system as a whole (including the fixture) will be calibrated. Also, individual cal-through-the-fixture calibrations can be performed and combined with results from previous autocal and cal-to-the-mint-pin calibrations to obtain additional fixture characterizations.

In yet another embodiment, the autocal procedure can be performed without again performing the manual calibrations. In this embodiment, the autocal procedure can be routinely performed to calibrate out certain variables and results of previous cal-to-the-mint-pin and cal-through-the-fixture characteristics can be used to fine tune the new autocal.

Figure 5:
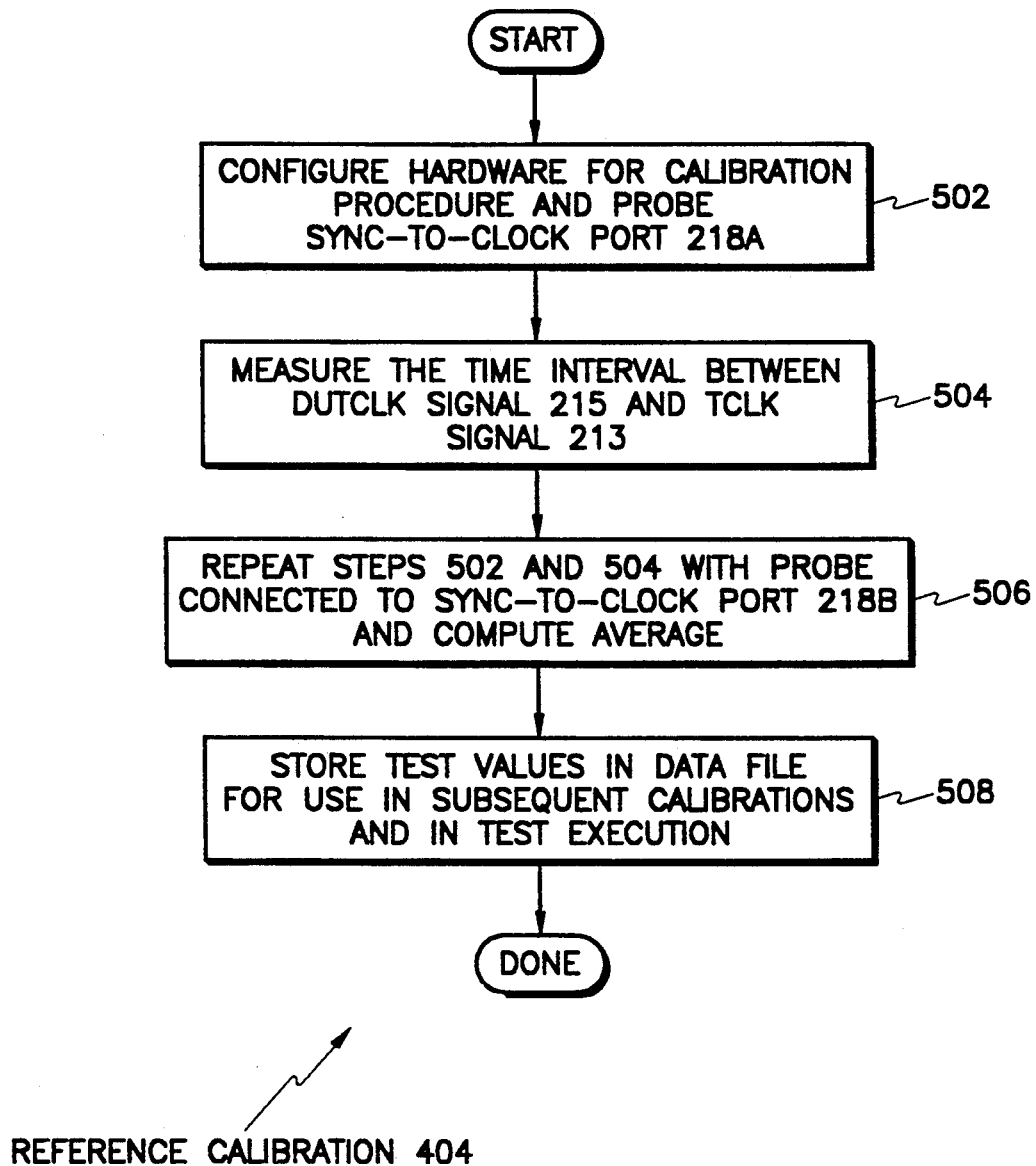
FIG. 5 is a flowchart illustrating the steps of performing a reference calibration used in a cal-to-the-mint-pin calibration.

FIG. 5 is a flowchart illustrating the reference calibration procedure 404 of step 404. Referring to FIG. 5, the reference calibration procedure 404 will be described in more detail. Since the probe receiver 232 is used as the timing reference for the manual calibrations, this initial reference calibration step 404 is required. The results of reference calibration 404 are later used in the driver and receiver calibrations at the mint pins and at the fixture nails in steps 406 and 408. This initial reference calibration procedure 404 provides a target time-interval-counter measurement to which all drivers 222 and receivers 223 can be matched to the sync-to-clock timing reference edge of a signal representing a reference signal from the board under test (in the preferred embodiment, DUTCLK signal 213).

The value of TCLK advance in probe module 210 has already been established by autocal in step 402. This value will not be changed by the reference calibration of step 404. Thus, this default value will not change because of any future calibration procedures used for this configuration.

Referring to FIGS. 2 and 5, the steps for the reference calibration 404 will now be described. In a step 502, the hardware of tester 200 is configured as shown in FIG. 2A. The probe module controller card 210 is configured as a master module with a reference clock generator 212 and a time interval counter 216. Probe 217 is placed on A sync-to-clock port 218A to receive DUTCLK signal 213. The master module controller card 210 is configured to be phase-locked to DUTCLK signal 213 at sync-to-clock port 218A. DUTCLK signal 213 is connected to the A sync-to-clock port 218A via a relay connection internal to controller card 210. This allows DUTCLK signal 213 to simulate an external clock reference signal. TCLK signal 215 is phase locked to DUTCLK signal 213 via clock generator 214. DUTCLK signal 213, fed to A sync-to-clock port 218A, is received by probe receiver 232 via probe 217.

In a step 504, a target time value measurement is performed. With master module controller card 210 phase-locked to the DUTCLK signal 213, the time interval between TCLK signal 215 and the signal received by probe receiver 232 is measured using time interval counter 216. Time interval counter 216 begins timing on an edge of TCLK signal 215. Time interval counter is stopped on the clock edge received by probe receiver 232.

This target time value measurement obtained in step 504 is a reference measurement to be used in subsequent calibrations. Note that this target time value measurement can be used to align drivers to the sync-to-clock edge of DUTCLK signal 213 that is the timing reference for the system. In later calibration steps, each driver will be connected to the probe receiver 232 via probe 217 and will then be adjusted until time interval counter 216 gives the same reference measurement as that made for this reference calibration measurement. Once this adjustment is made, drivers will be aligned with DUTCLK signal 213 edge, and thus will also be aligned with each other.

In another embodiment, the reference measurement of step 504 can be taken using an external clock signal instead of DUTCLK signal 213. In this case, the reference measurement will be with respect to this external clock signal, and when the drivers are calibrated in later calibration steps, they will be aligned with the external clock signal as well as aligned with each other.

In a step 506, steps 502 and 504 are repeated with the probe connected to the B sync-to-clock port 218B. A final reference value is computed that is the average of that measured using A sync-to-clock port 218A and B sync-to-clock-port 218B. In other embodiments, the average of the values measured for sync-to-clock-ports 218A and 218B need not be used. These other embodiments may use the value obtained in either case.

In a step 508, time measurement values obtained in steps 504 and 506 are stored in a data file for use in subsequent caluculations aaen during test execution.

In the preferred embodiment of the present invention, the pin card calibraion in step 406 is actually performed as two calibrations. First, a manual driver timing calibration to line up the drivers in the PIN cards is performed. Second, step 406 is completed by performing an automatic receiver timing calibration to line up the receivers in the PIN cards to themselves and to the already lined up drivers. The values obtained in the manual driver timing calibration part of step 406 are used to complete the automatic receiver timing calibration part of step 406. Both driver and receiver calibrations will be described in more detail in the paragraphs that follow.

Figure 6:
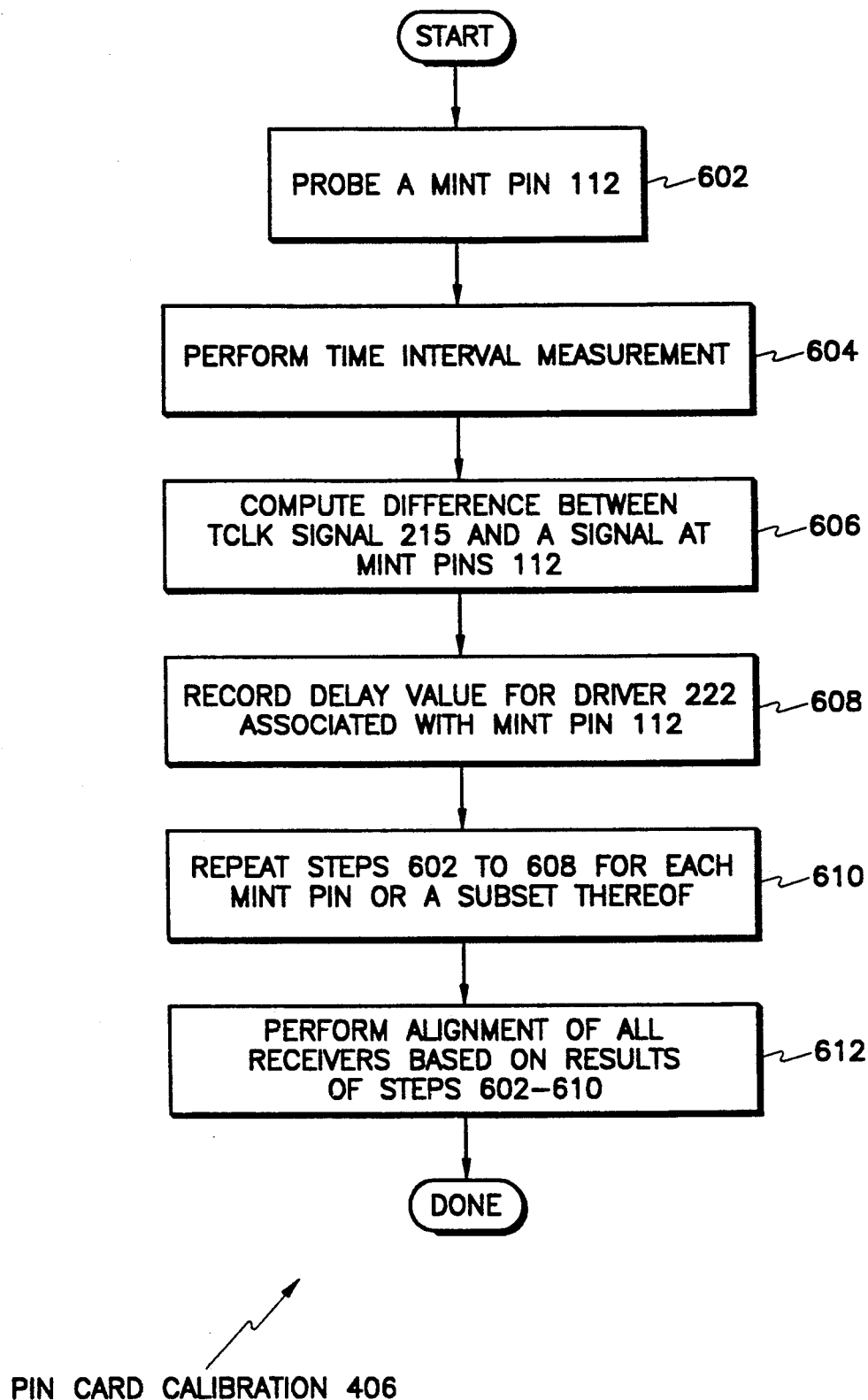
FIG. 6 is a flowchart illustrating the steps for performing a calibration at the mint pins or at the fixture nails.
Figure 7A:
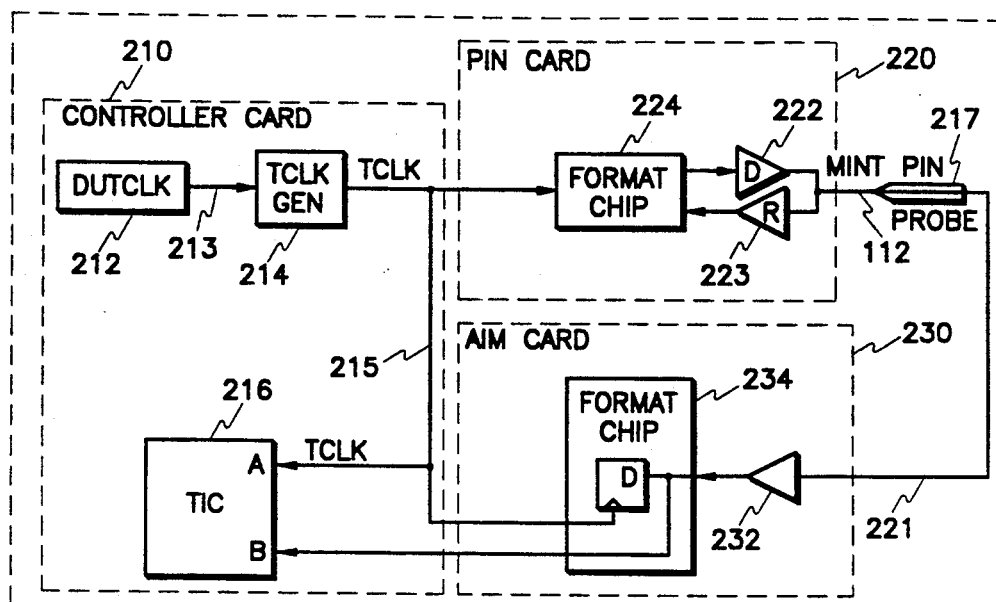
FIG. 7A illustrates a hardware configuration of the present invention for calibrating drivers associated with a probe module.
Figure 7B:
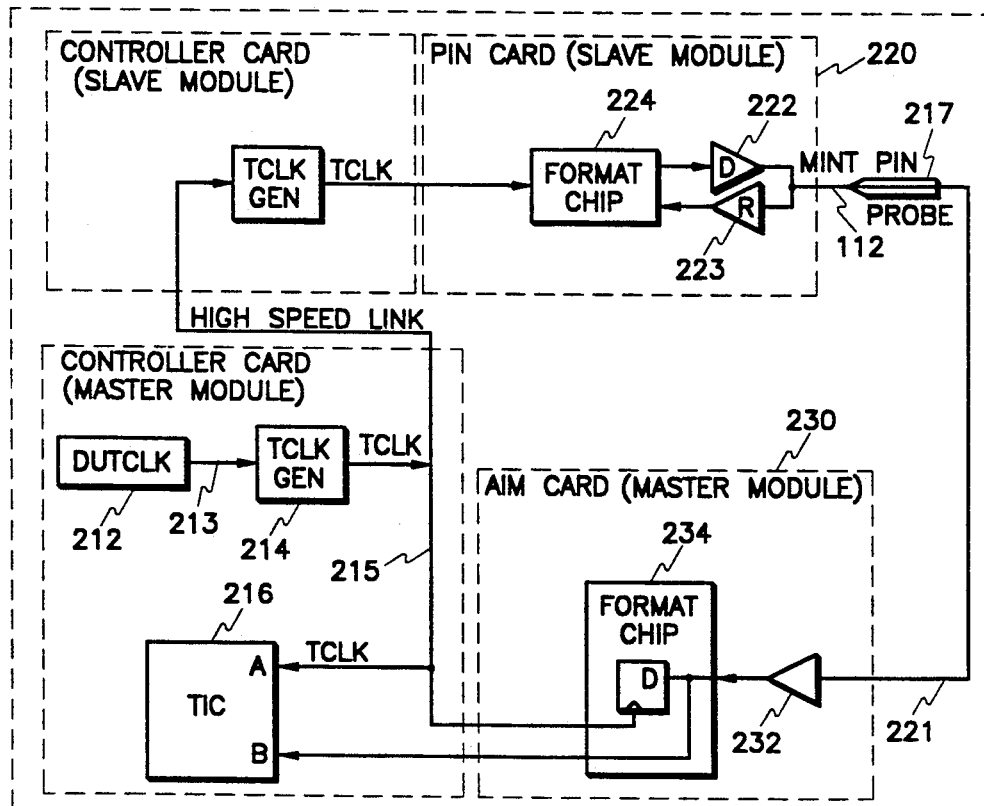
FIG. 7B illustrates a hardware configuration of the present invention for calibrating drivers associated with non-probe modules.

FIG. 6 is a flowchart illustrating the manual driver timing calibration technique 600 of the present invention. FIG. 7A illustrates the hardware configuration for calibrating drivers 222 associated with the probe module controller card. FIG. 7B illustrates the hardware configuration for calibrating drivers 222 in PIN cards 220 associated with additional modules. In the tester environment described above, there can be up to three additional modules for a total of four. Referring to FIGS. 7A and 7B, the purpose of this manual driver timing calibration technique is to line-up drivers 222 in all PIN cards with the reference timing edge of DUTCLK signal 213 at the sync-to-clock port 218A or 218B, or the average. This is done with the probe module configured as the master module controller card 210. The other test-module sets of controller cards 210 and pin cards 220 are configured as slave modules and are slaved to this master module. In the preferred embodiment, the autocal calibration of steps 402 and 403 has already done a module-to-module calibration for this configuration coarsely, characterizing all drivers and receivers in the modules. The TCLK advance values determined in the autocal of step 402 and stored in the autocal file made in step 403 are now used. Thus, the clock signals 215 and drivers 222 of the slave modules are coarsely aligned at this point. In fact, it is the goal of this part of the technique to leave the TCLK advance values (resulting from module-to-module autocal) in the slaves alone. Adjustments to driver 222 timing in the slave modules will be made by adjusting the delay lines in format chips 224 for each driver 222 and not by changing the TCLK advance of that slave module.

Referring to FIGS. 6, 7A and 7B, the steps for manual driver timing calibration will now be described. In a step 602, the probe is connected to a mint pin 112.

In a step 604, time interval counter 216 is started on TCLK signal 215. Time interval counter 216 is stopped on the clock signal received at probe receiver 232. Note that it is okay to send DUTCLK signal 213 to clock generator 214 via an internal path rather than through a relay connection to the A sync-to-clock port 218A. This is allowed because the probe reference measurement of step 404 at time interval counter 216 was made relative to TCLK signal 215 and DUTCLK signal 213. Thus, the proper relationship is maintained as long as TCLK signal 215 is used as a timing reference for time interval counter 216, even when the timing of the DUTCLK signal 213 to clock generator 214 path changes.

Using a "software debouncing" technique, the software waits until the probe contacts the mint pin consistently for a sufficient time to make an accurate measurement. The measurement is recorded. Software debouncing techniques are known to those of ordinary skill in the art.

In a step 606, the time difference between TCLK signal 215 and a signal derived from TCLK signal 215 at mint pins 112, through probe receiver 232, is calculated in time interval counter 216. In the preferred embodiment, this time measurement is taken for both rising and falling edges and the average of the rising and falling edges is computed and used as the measurement value.

The difference between the measurement value determined in step 606 and the reference measurement recorded previously (in step 508), is the time adjustment needed to align that driver 222 with the timing reference edge at the sync-to-clock port 218A. This is the amount of delay adjustment required in format chip 224.

In a step 608, the value for driver 222 is recorded in a table. Steps 602 to 606 are repeated for each mint pin or a subset thereof, thereby generating a complete table of adjustment values. As a result, the test module channels have been characterized.

The table of adjustment values is integrated with the autocal table settings determined in autocal to create a refined set of calibration data. These new values are used to adjust the format delays of drivers 222, and drivers 222 are deskewed relative to the reference signal.

Completing steps 602-610 completes the manual driver timing calibration. In a step 612, a manual receiver timing calibration is performed. The purpose of manual receiver timing calibration is to line-up the receivers 223 in all the modules (up to four) with each other as well as with the aligned drivers 222 in all the modules. The same table of adjustment values that was learned during manual driver calibration is applied to all receivers 223 just as it is applied to all drivers 222. As a result, each receiver 223 is now aligned with its local driver 222. Also, because drivers 222 have been deskewed using these adjustment values, all receivers 223 will be deskewed relative to each other as well as relative to the drivers.

In other words, since receivers 223 use their respective drivers 222 as their calibration reference during autocal, an error in driver 222 timing results in an error in receiver 223 timing. Therefore, the same correction factor determined for a driver 222 in the manual driver calibration also corrects the timing of its respective receiver 223.

Thus, in receiver timing calibration, the timing of receivers 223 is not measured. Instead, receiver timing calibration applies the same adjustment to receivers 223 that was determined from measuring only drivers 222. As with driver 222, the receiver alignment values are used to update the autocal table and the format chips 224 are adjusted.

As a result of the manual driver and receiver timing calibration, the test-module channels have been characterized and adjusted.

Under the calibration technique of the present invention, driver 222 and receiver 223 calibration is not performed the same way for the probe circuit receiver 232 as described above for other drivers 222 and receivers 223 in the system. A driver (not shown) on AIM card 230 sends a signal to the input of probe receiver 232. A simulated probe tip (not shown) is located on the signal path between the driver and probe receiver 232, and is used as part of the probe receiver 232 calibration process. Thus, the probe cable 221 in series with the probe receiver 232 is not included in the calibration measurement.

To calibrate probe receiver 232, a time measurement is taken between TCLK 215 and the driver output using the simulated probe tip. Since the probe cable length is known, the time measured is adjusted to compensate for the probe cable length, and the delay of probe receiver 232 can be changed by this adjusted time measurement. This is a coarse calibration of probe receiver 232.

This coarse calibration is fine tuned by measuring the difference between DUTCLK signal 213 and TCLK 215 using test'probe 217, and determining the difference between the estimated and this actual measurement. The format chip is adjusted to correct the delay probe receiver 232.

This technique requires that an assumption be made about the electrical length, and hence time delay, of the probe receiver cable 221 for purposes of autocal on the probe receiver 232. In manual driver timing calibration portion of PIN card calibration 406, probe 217 is used to measure each driver 222 in the system by measuring its output at the mint pin 112. Thus, the actual length of the probe cable 221 is included in these measurements. In fact, when the probe reference measurement is initially made by touching probe 217 to the sync-to-clock port 218A or 218B, the probe receiver 232, including the probe cable 221 and actual probe 217, is calibrated by default. That is, the reference delay measured for probe 217 relative to an external timing edge becomes the target delay for every driver 222 in the system. Another way to view this is to realize that manual calibration does not change the delay settings on the probe receiver 232-the autocal settings are left intact. In addition, all the other drivers 222 in the system are adjusted to be aligned with the probe receiver 232.

The cal-through-the-fixture calibration procedure of step 408 is performed similar to the cal-to-the-mint-pin procedure of steps 406 as described in steps 602 to 612. In cal-through-the-fixture calibration, instead of touching probe 217 to mint pins 112 to measure driver 222 time intervals, probe 217 is touched to fixture nails 114 at the end of the fixture to be calibrated. A table of values for the fixture is generated similar to the table of values generated during the cal-to-the-mint-pin procedure. This fixture table augments the autocal table generated by the autocal calibration and updated by the cal-to-the-mint-pin calibration. The values in the fixture table uniquely characterize each fixture. An advantage of a separate table of values for each fixture is that the fixtures may be transported from one testhead to another (along with its fixture table) without the need for another manual fixture calibration.

A complete cal-to-the-mint-pin calibration need not be done to the whole tester if a part of the tester is replaced. Only the part (and, in a few cases, immediately affected parts) replaced needs to be remeasured manually to update the calibration.

As discussed above, the tester that is the environment of the present invention can be configured to house as many as four modules. Referring again to FIG. 3, when multiple modules are used, one is configured as the master module, (controller card 210B and pin card 220B), and the others configured as slaves. One of these modules is designated as the probe module. A module-to-module calibration technique is provided as a part of the present invention to keep the drivers 222 and receivers 223 of all the modules aligned despite the fact that the master module may be any of the three modules that were not master during a previous manual receiver and driver timing calibration. In other words, because any of the four modules can be assigned as the master, the alignment of TCLK signal 215 in each module will change slightly when one of the three modules that were slaves during the manual driver/receiver calibration is assigned to be the master.

This reassignment will cause a misalignment of drivers and receivers. To correct this misalignment for these three new configurations, the module-to-module calibration technique adjusts the temporal positions (timing) of TCLK signals 215 in each module so that they will have the same relative positions as they held during the previous manual driver/receiver calibration. Note that the goal is not to deskew the four TCLK signals 215 relative to one another, but to make them the same as during the manual driver/receiver calibration. Once this is done, the drivers and receivers will be once again aligned for this new master module configuration.

In the preferred embodiment, before a module-to-module calibration may be performed, a normal automatic calibration has already been completed and any drivers to be used in this procedure must have been calibrated using the manual driver timing calibration procedure outlined above.

Completing the autocal calibration as discussed above, yields values for TCLK advance for each master module configuration such that the system will function properly, including a high speed link 310 that ties the TCLK signals 215 of all modules together. The manual multi-module calibration procedure will adjust these TCLK advance values only slightly and will not cause any malfunctions of the high speed link 310 or other system functions.

The driver and receiver format chip 224 delay lines should not have been adjusted yet with the values learned in the manual driver/receiver timing calibration procedure. Also, TCLK advance in the probe module 210A should not be adjusted until all the measurements in the manual multi-mode calibration procedure have been completed.

Figure 8:
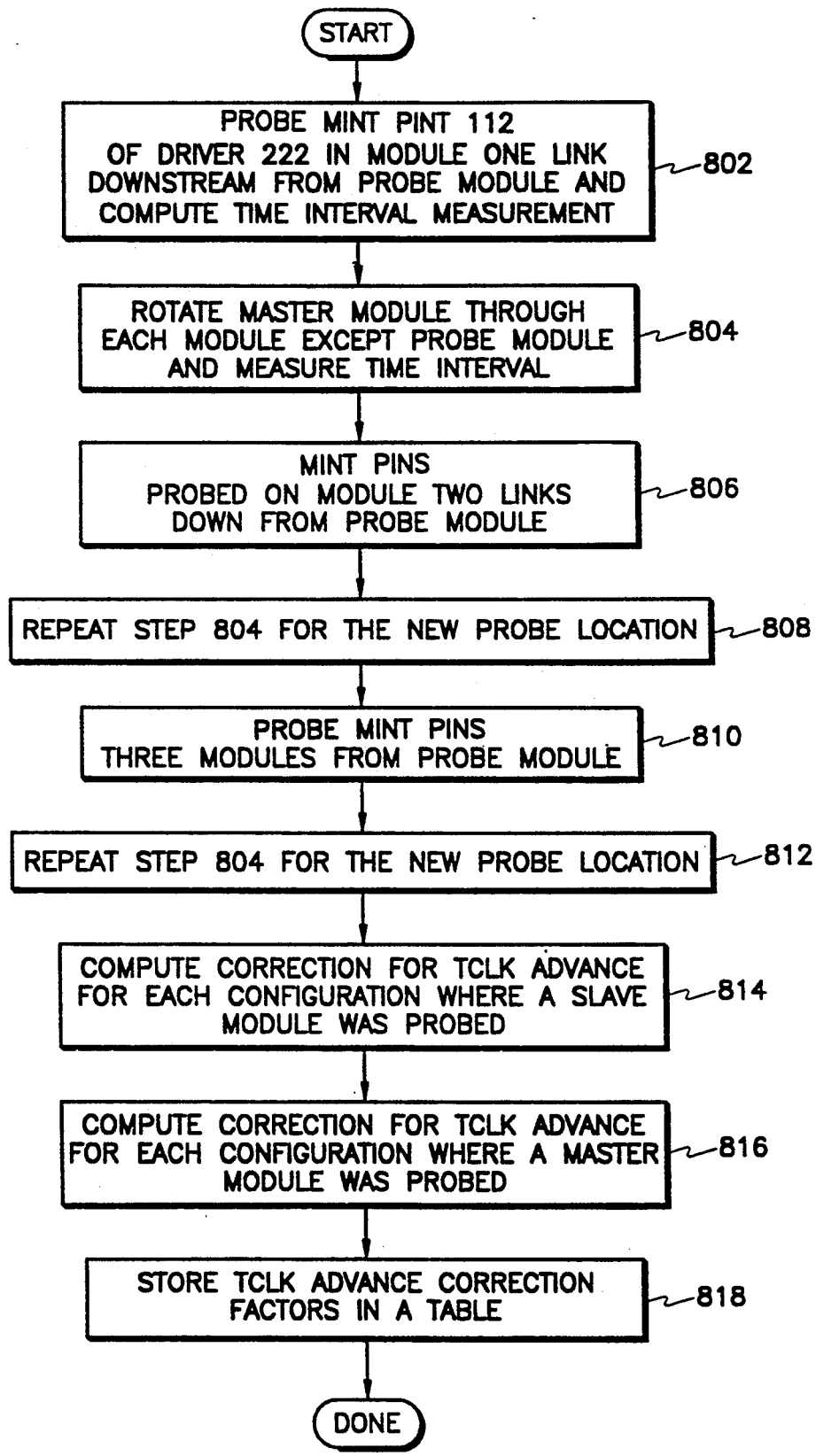
FIG. 8 illustrates the steps of manual multi-module calibration.
Figure 9:
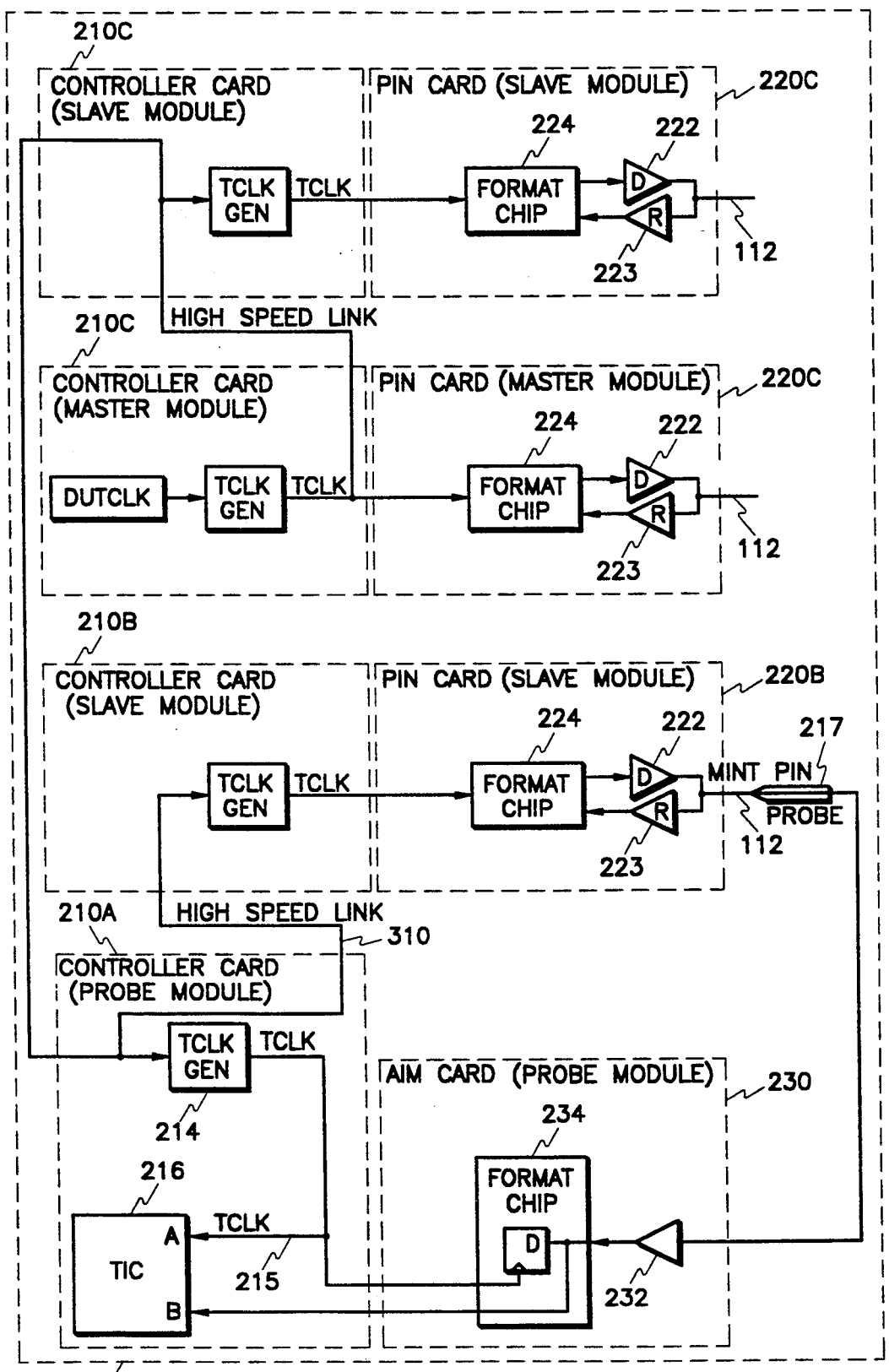
FIG. 9 illustrates the hardware for a slave module measurement.

FIG. 8 is a flowchart illustrating the steps of the manual multi-mode calibration technique of the present invention. FIG. 3 illustrates the configuration for a master module measurement in a four-module system. FIG. 9 illustrates a slave module measurement. Referring to FIGS. 3, 8, and 9, in a step 802, probe 217 is connected to a driver 222 in the controller card 210 and PIN card 220 module that is one module downstream from the probe module. Time interval counter 216 is started on the slaved TCLK signal 215 of the probe module. Time interval counter 216 is stopped on the probe receiver. The TCLK advance values learned in the previously performed autocal procedure are used.

In a step 804, one at a time, each module is configured as the master module except the probe module. For each module as master, a driver 222 on each module is measured through probe receiver 232 to time interval counter 216. There will be n−1 measurements taken for an n-module system in this step 804.

In a step 806, if the tester is configured as a three or four module system, the user is prompted to place the probe on one of the mint pins 112 in the module two links downstream from the probe module. In a step 808, step 804 is repeated for the new probe 217 location of step 806.

If the tester is configured as a four module system, in a step 810, the user is prompted to place probe 217 on one of the mint pins 112 in the module three links downstream from this probe module. In a step 812, step 804 is repeated for this probe 217 location.

In a step 814, the measurements taken for each configuration where probe 217 was touched to a slave module mint pin 112 are used. Note that this situation exists for only 3 and 4 module systems. Each measurement is adjusted by the value learned in the manual driver calibration procedure for its particular driver 222. This is where the manually calibrated driver 222 would appear to be. The difference between this adjusted measurement and the reference measurement is the correction needed for the TCLK advance in the slave module holding the driver 222 being measured. Adjusting TCLK advance in this slave module by this amount will cause the driver being measured and all the other drivers in this module to be once again aligned with the target value as measured by the time interval counter through the probe receiver 232.

In a step 816, the measurements taken for each configuration where the probe was touched to the master module are used. Each measurement is adjusted by the value learned in the manual driver calibration procedure for its particular driver 222. This is where the manually calibrated driver 222 would appear to be. The difference between this adjusted measurement and the reference measurement is the correction needed for the TCLK advance in the master module holding the driver being measured. However, because this is a master module, changing its TCLK advance causes the master and slaves to all move the same amount. Thus, changing the TCLK advance in the master module does no good. The correction factor must be applied to the TCLK advance on all three slaves in order to affect a shift in the master module's TCLK relative to the slaves. Adjusting TCLK advance in all slave modules by this amount will cause the driver being measured and all the other drivers in this module to be once again aligned with the target value as measured by the time interval counter through the probe receiver.

In a step 818, the TCLK advance correction factors learned in this procedure are stored in a table and used with the appropriate master configuration.

A manual synchronization to clock calibration is provided to deskew drivers and receivers relative to an external clock supplied by the device under test. This procedure uses a time interval measurement technique to align an edge at the sync-to-clock port (either a mint pin or a fixture nail, depending on the type of cal being performed) of non-probe master modules with all drivers and receivers that have already been aligned.

Only the probe receiver is needed in this procedure. Therefore, it is not necessary to first apply the correction factors to the drivers and receivers learned in a previous manual driver/receiver calibration procedure.

However, it is necessary to apply the correction values learned in module-to-module calibration to TCLK advance in slave modules for each of the three master module configurations used in this procedure.

Because sync-to-clock calibration has been performed by default on the probe-module-as-master configuration, the synchronization-to-clock technique needs to be performed only on any remaining non-probe modules.

Figure 10:
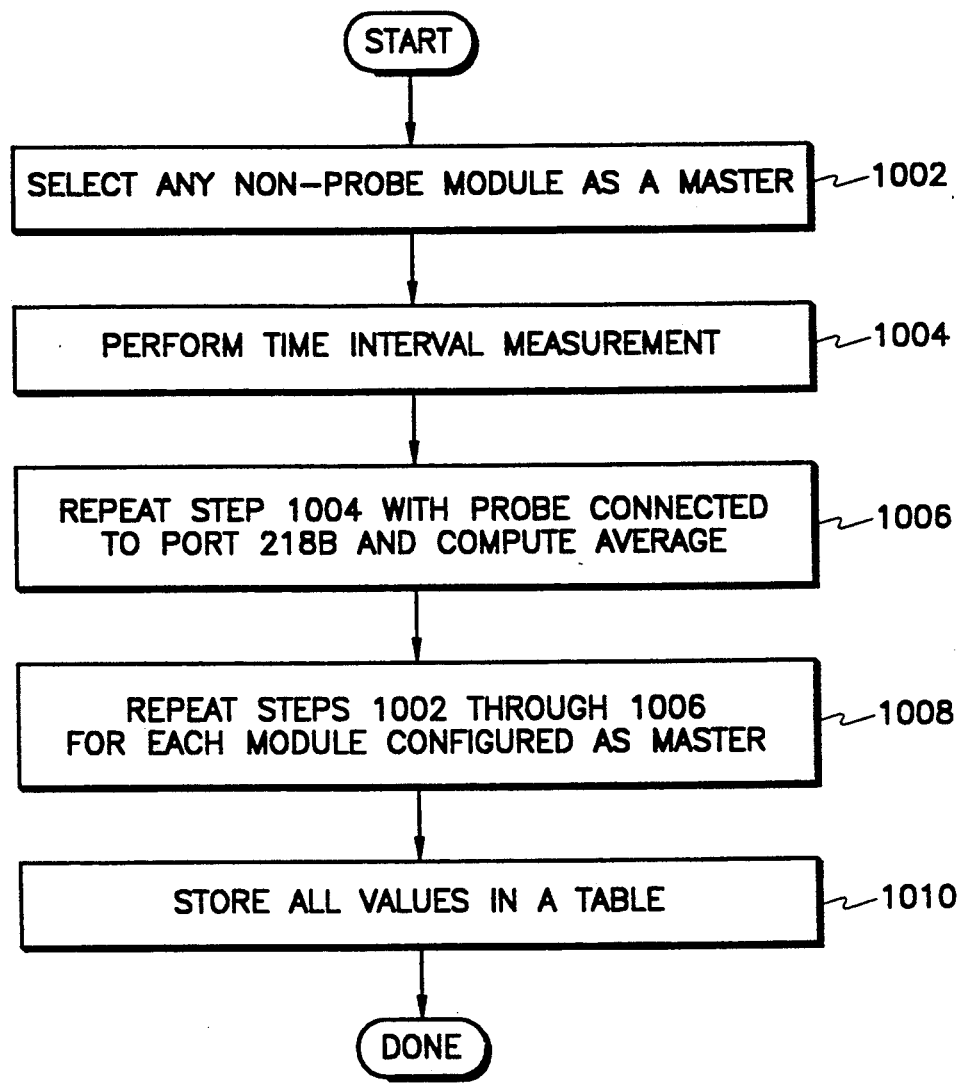
FIG. 10 is flowchart illustrating the steps of synchronization to an external clock calibration.
Figure 11:
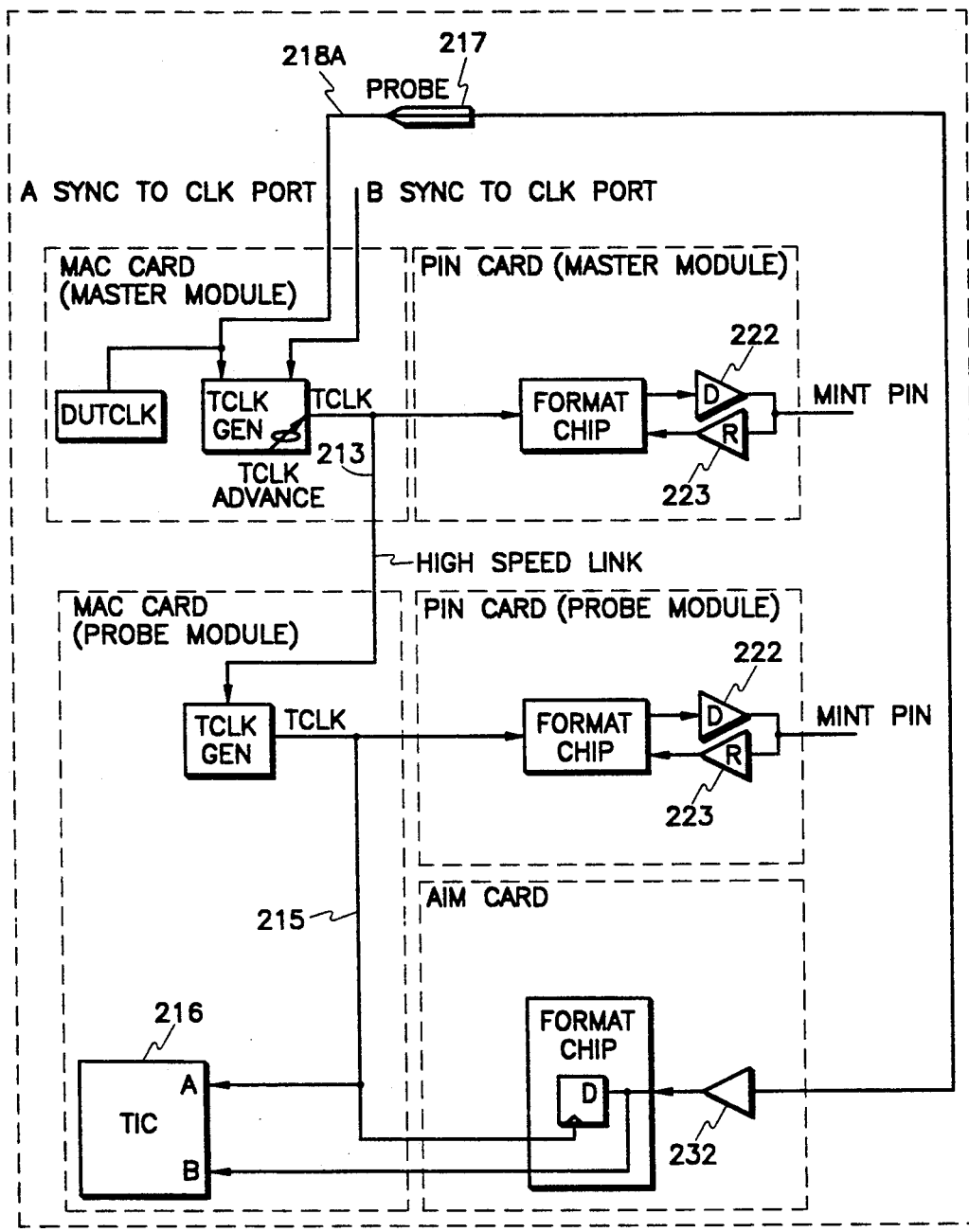
FIG. 11 illustrates the hardware configuration for a synchronization to external clock calibration.

FIG. 10 illustrates the steps for a synchronization to external clock calibration procedure. FIG. 11 illustrates the configuration of the system. Referring now to FIGS. 10 and 11, this procedure will now be described.

In a step 1002, any non-probe module is selected as the master, and the TCLK advance corrections learned in module-to-module cal for this configuration are applied.

In a step 1004, the system is configured as shown in FIG. 11. Probe 217 is connected to the A Sync-to-clock port 218A. DUTCLK signal 213 is connected to A sync-to-clock port 218A on controller card 210. The master module is configured to sync to the signal on A sync-to-clock port 218A. Note that DUTCLK signal 213 connected internally to A sync-to-clock port 218A is a "free running" clock. Thus, it can be used as an "external" clock to which the master module can be synchronized. Also note that the same signal being fed to A sync-to-clock port 218A is also being fed to the probe receiver.

With the master module phase-locked to DUTCLK signal 213, a time interval measurement is performed by starting time interval counter 216 on TCLK signal 215 and stopping time interval counter 216 on the clock edge received by probe receiver 232. The difference between this measurement and the original reference measurement is the amount needed to adjust the value presently in the TCLK advance delay line in the master module so that all drivers 222 and receivers 223 are aligned with the sync-to-clock timing reference edge.

In a step 1006, step 1004 is repeated with probe 217 connected to the B sync-to-clock port 218B. The average time interval measurement of the two ports is computed and used to make the actual adjustment to TCLK advance.

In a step 1008, steps 1002, 1004 and 1006 are repeated for the other modules as master.

4. User Interface for Calibration Through the Mint Pins

A preferred embodiment of the user interface of the present invention will now be described. The user interface of the present invention includes an additional selection on a main menu of the tester of the example environment. The new selection, initiates the cal-to-the-mint-pin procedures described above.

When the new menu item is selected, a new submenu will be displayed. The submenu provides the user with the option of performing a calibration on all pin cards, or a partial calibration on a particular pin card or set of pin cards. If a partial calibration is selected, the system prompts the user to enter the module and slot numbers of the cards to be calibrated before test execution can begin. If a calibration on all cards is selected, test execution begins immediately.

During test execution, the user will be asked to probe various mint pins. If a measurement fails, the user will be required to retry the location again or abort the test without saving any values; no bad values will be saved. If the measurement passes, the user still has the option to back up one and readjust the previous location. This option is provided to cover the case of probe slippage or some other error which was not severe enough to cause the measurement to fail entirely.

5. User Interface for a Calibration-Through-the-Fixture Session

The cal-through-the-fixture procedure is initiated by a BT-BASIC command, learn fixture timing for <scope>, where <scope> can be one of the following:

| | |
|---|---|
| all | adjust all drivers/receivers* used for the board test |
| tests <test_name_list> | adjust all drivers/receivers* used for the specified tests, as specified in the wirelist object. Each test can be for a single device or a cluster. The <test_name_list> should be a list of one or more test names in quotes, with test names separated by commas. |
| nodes <node_name_list> | adjust all drivers/receivers* on the specified nodes, as specified in the wirelist object. The <node_name_list> should be a list of one or more node names in quotes, with node names separated by commas. |
| pins <device.pin_list> | adjust all drivers/receivers* on the specified pins on a device. The <device.pin_list> should be a list of one or more device.pin specifications (the device name and pin number separated by a period), with each device.pin separated by commas. |

*The sync-to-clock connection will also be adjusted if it is present.

Some examples of valid syntax for the learn fixture timing command are:
learn fixture timing for all
learn fixture timing for tests "u101"
learn fixture timing for tests "u101", "u102", "u103"
learn fixture timing for nodes "A_IN", "B_IN"
learn fixture timing for tests "u101.1"
learn fixture timing for tests "u101.1", "u101.2", "u101.3"

The user will be asked to place the testhead probe on various probe locations on the fixture (i.e. fixture nails). Express fixture locations are identified by an extended bank-flow-column notation (the same notation which is used in the fixturing reports generated by the testers).

Note that the bank-row-column location information is not available for certain types of fixtures. For calibrating these fixtures, the person performing the procedure will have to determine the appropriate probing locations by referencing documentation from the fixture builder or by other means.

Only one adjustment will be stored per mint pin in the calibration tables. This implies that if a bank-row-column mint pin is wired to two or more fixture nails, all probe locations will be reported and the person who performs the adjustment procedure will have to select one of the probes as the point to be adjusted.

Sometimes, there may be multiple fixtures for a board. The user has several options for handling this situation. If there are two or more fixtures with substantially identical wiring, the user may calibrate one fixture and assume that the fixture delays are the same for the other fixtures. In this case, no additional work needs to be done. Constructing the multiple fixtures as close to identical as possible and sharing the calibration table generated for one of these fixtures is the simplest method and is highly recommended.

If the user would prefer to calibrate each fixture individually, the testplan must be modified to copy the appropriate fixture cal table to the fixture/cal file before the "load board" command is performed in the testplan. There are two ways to determine which fixture is present. If the fixtures are given different fixture ID's (autofile codes), the autofile command can be used to determine which fixture is present. If the two fixtures have identical fixture ID's, the operator must be queried to determine which fixture is present.

The following procedure is provided as an example for setting up the testplan to handle two fixtures for the same board which have different fixture ID's:
1. Calibrate the first fixture (for example, Fixture ID 1001).
2. Copy the file fixture/cal to a new file fixture/cal1001.
3. Calibrate the second fixture (for example, Fixture ID 1002).
4. Copy the file fixture/cal to a new file fixture/cal1002.
5. Add the following lines to the testplan just prior to the "load board" command:

```
if autofile = 1001 then
  copy "fixture/cal1001" over "fixture/cal"
else
  if autofile = 1002 then
    copy "fixture/cal1002" over "fixture/cal"
  else
    print "WARNING: Fixture ID not recognized"
    ! branch to appropriate location in testplan (retry or abort)
  end if
end if
```

For TCM, there should be two files in/hp307-0/autofile (1001 and 1002 in the example), each referring to the same board directory.

If the fixture ID's are the same, the following example may be used as a model:
1. Calibrate the first fixture (for example, Fixture "A").
2. Copy the file fixture/cal to a new file fixture/cal_A.
3. Calibrate the second fixture (for example, Fixture "B").
4. Copy the file fixture/cal2 to a new file fixture/cal_B.
5. Add the following lines to the testplan just prior to the "load board" command:

```
input "Enter fixture letter (A or B):";FixtureLetter$
if FixtureLetter$ = "A" then
  copy "fixture/cal_A" over "fixture/cal"
else
  if FixtureLetter$ = "B" then
    copy "fixture/cal_B" over "fixture/cal"
  else
    print "WARNING: Fixture letter not recognized:
    ! branch to desired location in testplan (retry or abort?)
  end if
end if
```

Note that these examples are intended only to demonstrate the concept; some modifications may be required to customize the example to the user's situation.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:
1. A system for calibrating testers comprising:
 (a) a signal generator for generating an internal timing signal;
 (b) at least one test module connected to said signal generator for interfacing to a device under test;
 (c) a test probe for receiving test signals at various locations;
 (d) a time measurement device, connected to said signal generator, for measuring the time difference between edges of a signal generated by said signal generator and edges of test signal received by said test probe;
 (e) a probe interface channel, connected to said test probe and to said time measurement device, for receiving test signals from said test probe; and
 (f) wherein said test module comprises a plurality of test-module channels for sending signals to and receiving signals from a device under test.

2. The system of claim 1, further comprising a second signal generator, connected to said signal generator, for generating a reference timing signal at an output port of one of said test modules.

3. The system of claim 1 further comprising a user interface, connected to said test module, configured to prompt users for inputs.

4. The system of claim 2 further comprising a user interface, connected to said test module, configured to prompt users for inputs.

5. The system of claim 1 further comprising a storage device for storing values determined by said test modules, said storage device connected to said test modules.

6. The system of claim 2 further comprising a storage device for storing values determined by said test modules, said storage device connected to said test modules.

7. The system of claim 1, wherein said test-module channels comprise:
 drivers for sending signals to the device under test;
 receivers for receiving signals from the device under test; and
 independent delay means for adjusting the timing of said signals sent to and received by said drivers and receivers, respectively.

8. The system of claim 2, wherein said test-module channels comprise:
 drivers for sending signals to the device under test;
 receivers for receiving signals from the device under test; and
 independent delay means for adjusting the timing of said signals sent and received by said drivers and receivers, respectively.

9. The system of claim 7, wherein said probe interface channel comprises:
 a probe receiver for receiving said test signals from said test probe; and
 second independent delay means, coupled to said probe receiver, for adjusting the timing of said received test signals.

10. The system of claim 8, wherein said probe interface channel comprises:
 a probe receiver for receiving said test signals from said test probe; and
 second independent delay means, coupled to said probe receiver, for adjusting the timing of said received test signals.

11. The system of claim 1, wherein said signal generator is of the phase-locked loop type, capable of being adjusted by an input signal.

12. The system of claim 1, further comprising:

first means for characterizing at least one of said test-module channels using a time-target signal and an internal timing signal, wherein said internal timing signal is generated by said signal generator;

second means, coupled to said first means, for determining a time measurement value, wherein said time measurement value is used to adjust said internal timing signal;

third means, coupled to said second means, for determining individual time values necessary to synchronize at least one of said test-module channels, wherein said determination is based on a temporal relationship between said internal timing signal and signals at test-module mint pins; and fourth means, coupled to said third means for adjusting said test modules based on said individual time values.

13. The system of claim 12, further comprising fifth means, coupled to said third means, for recording said individual time values.

14. The system of claim 12, wherein said second means further comprises fifth means for performing a reference calibration to obtain a target time value measurement based on a temporal relationship between a signal representing a reference signal from a device under test and said internal timing signal.

15. The system of claim 14, wherein said fifth means comprises:

means for characterizing test modules and said internal timing signal in response to time interval measurements between said internal timing signal and said signal representing a reference signal from a device under test;

means for providing characterized parameters as a result of said characterization;

means for adjusting test module timing and a temporal position of said internal timing signal based on said characterized parameters; and means for recording said characterized parameters.

16. The system of claim 12, wherein said fourth means comprises means for adjusting an amount of delay introduced in said test-module channels.

17. The system of claim 12, further comprising:

a calibration fixture having a plurality of fixture paths and fixture nails;

means for measuring temporal relationships between said internal timing signal and a signal representing said internal timing signal at said fixture nails to characterize time delays through at least one of said fixture paths; and means for adjusting said test modules in response to said temporal relationships between said internal timing signal and a signal at said fixture nails.

* * * * *